United States Patent
Chan (10) Patent No.: US 9,214,211 B2
(45) Date of Patent: Dec. 15, 2015

(54) METHODS OF AND APPARATUS FOR DETERMINING UNIQUE DIE IDENTIFIERS FOR MULTIPLE MEMORY DIE WITHIN A COMMON PACKAGE

(71) Applicant: Winbond Electronics Corporation, Taichung (TW)

(72) Inventor: Johnny Chan, Fremont, CA (US)

(73) Assignee: WINBOND ELECTRONICS CORPORATION, Taichung (TW)

( * ) Notice: Subject to any disclaimer, the term of this patent is extended or adjusted under 35 U.S.C. 154(b) by 91 days.

(21) Appl. No.: 14/278,962

(22) Filed: May 15, 2014

(65) Prior Publication Data
US 2015/0332747 A1 Nov. 19, 2015

(51) Int. Cl.
*G06F 3/00* (2006.01)
*G11C 8/18* (2006.01)

(52) U.S. Cl.
CPC .................................... *G11C 8/18* (2013.01)

(58) Field of Classification Search
None
See application file for complete search history.

(56) References Cited

U.S. PATENT DOCUMENTS

| 5,642,307 A * | 6/1997 | Jernigan ............... G06F 11/006 235/375 |
| 6,161,213 A * | 12/2000 | Lofstrom ............... H01L 23/544 257/E23.179 |
| 6,366,487 B1 | 4/2002 | Yeom |
| 7,046,536 B2 * | 5/2006 | Roohparvar ........... G11C 16/20 365/45 |
| 7,088,132 B1 | 8/2006 | Tang et al. |
| 7,531,907 B2 * | 5/2009 | Guruz ..................... G03F 1/14 257/797 |
| 7,558,900 B2 | 7/2009 | Jigour et al. |
| 9,082,469 B2 * | 7/2015 | Ogawa .................... G11C 8/12 |
| 2002/0188779 A1 * | 12/2002 | Ochi ................. H04N 21/43632 710/104 |
| 2003/0123287 A1 | 7/2003 | Gorobets |
| 2006/0212693 A1 | 9/2006 | Cho et al. |
| 2008/0082735 A1 | 4/2008 | Shiga |
| 2009/0085608 A1 | 4/2009 | Alzheimer |
| 2010/0262753 A1 | 10/2010 | Richmond et al. |
| 2011/0195529 A1 | 8/2011 | Wu |
| 2012/0084491 A1 | 4/2012 | Park et al. |
| 2015/0186067 A1 | 7/2015 | Shu et al. |

OTHER PUBLICATIONS

Chen, Hui et al. Stacked Die Flash Memory Device with Serial Peripheral Interface, U.S Appl. No. 14/194,248, Feb. 28, 2014. 43 Pages.
Spansion Inc. Data Sheet, S70FL256P 256-Mbit CMOS 3.0 Volt Flash Memory with 104-MHz SPI (Serial Peripheral Interface) Multi I/O Bus Data Sheet, Revision 05, Jan. 30, 2013. 19 Pages.
Winbond Electronics Corporation. W25N01GV spiflash 3V 1G-Bit Serial SLC Nand Flash Memory with Dual/Quad SPI & Continuous Read, Preliminary Revision B, Nov. 26, 2013. 69 Pages.
Winbond Electronics Corporation. W25Q256FV spiflash 3V 256M-Bit Serial Flash Memory With Dual/Quad SPI & QPI, Revision F, Oct. 16, 2013. 108 Pages.

* cited by examiner

*Primary Examiner* — Elias Mamo
(74) *Attorney, Agent, or Firm* — David H. Caroll (57) ABSTRACT

Respective die IDs are determined for a plurality of memory die commonly packaged as a memory device based on their respective Unique Identifiers ("UIDs"). An external controller initiates an internal Die ID ("DID") determination process in which each die eventually asserts a signal on its inter-die signaling pin after a number of clocks as determined by its UID, and assigns itself a Die ID based on the number of signals asserted by other die prior to its own signaling response. Each die keeps track of the number of signals asserted by the other die prior to its own signaling response, as well as, optionally, the total number of signals on the signaling pin to determine the package die count for the device.

14 Claims, 8 Drawing Sheets

METHODS OF AND APPARATUS FOR DETERMINING UNIQUE DIE IDENTIFIERS FOR MULTIPLE MEMORY DIE WITHIN A COMMON PACKAGE

BACKGROUND OF THE INVENTION

1. Field of the Invention

The present invention relates to commonly packaged multiple memory die, and more particularly to methods of and apparatus for determining unique die identifiers for multiple memory die contained within a common package.

2. Description of Related Art

The packaging of two or more memory die in one package for various purposes is commonplace. The die may be identical or different. In some instances the respective interfaces of the die are partially or fully interconnected, so that a technique is needed for distinguishing among the various die using the pins of the package. This problem is particularly acute where the die are of the same type.

The chip select pins of stacked memory die may be used to distinguish among the die. As disclosed in Spansion Inc., Data Sheet, S70FL256P 256-Mbit CMOS 3.0 Volt Flash Memory with 104-MHz SPI Multi I/O Bus, Revision 05, Jan. 30, 2013, two identical 128 Mb die are stacked with their individual Chip Select inputs bonded to respective pins of the package to form the flash memory device. Such a memory device may be operated as two separate SPI devices on the same SPI bus, in that the user accesses one die of the dual die stack at a time via its respective Chip Select. Disadvantageously, the controller is required to provide and manage multiple /CS control signals. Moreover, the need for two or more chip select pins eliminates Quad SPI and Quad Peripheral Interface ("QPI") as suitable options for an 8-pin package.

A memory die typically has a unique identifier ("UID") established at manufacture, typically for production control. An example of a suitable UID is the combination of a device number, process lot number, wafer number, and x and y coordinates of the die, thereby ensuring the uniqueness of the UID. Such a UID could be used to distinguish one die from the other die in a package through a common interface if the UID were known to the external controller. Unfortunately, after the interfaces of the die are interconnected during manufacture, the individual UIDs may not be accessible and therefore may be unknowable to an external controller.

A technique for programming stack positions of memory die in multi-die memory devices after packaging is disclosed in US Patent Application Publication No. US 2009/0085608 published Apr. 2, 2009 in the name of Alzheimer. Each die drives an output signal to a commonly shared output terminal in response to a die identification data bit of the die. Each die also includes an arbitration circuit that generates a control signal in response to the identification bit of one die being mismatched to a corresponding identification bit of the other die. The control signal also programs a stack enable fuse in accordance with certain results of the arbitration.

BRIEF SUMMARY OF THE INVENTION

One embodiment of the present invention is a method to determine respective die identifiers ("DIDs") for a plurality of commonly-packaged memory die having respective unique identifiers ("UIDs"), comprising: enabling a common connection between the memory die; establishing respective die selection criteria for the memory die based on the UIDs of the memory die; synchronously clocking the memory die; and in each of the memory die during the clocking thereof: determining when the die selection criteria thereof is met as a function of the clocking thereof; generating a signal on the common connection in response to the determining step; monitoring the common connection prior to the generating step to increment a die position ("DP") parameter when a signal is present on the common connection; and establishing the DP parameter as the DID.

Another embodiment of the present invention is a multichip module device comprising: a plurality of memory die, each comprising a unique identifier ("UID"), a die identifier ("DID") control circuit, a plurality of interface pins, and an inter-die signaling pin; and a package containing the plurality of memory die in a multichip module configuration and having a plurality of package pins, at least one of the package pins being coupled to at least one of the interface pins of each of the memory die having a memory addressing capability. Each of the DID control circuits comprises: a signaling circuit coupled to the inter-die signaling pin; a counter circuit coupled to the signaling circuit and configured to activate the signaling circuit upon the occurrence of a number of clocks based on the UID; and a signal counter coupled to the inter-die signal pin and configured to increment a die position ("DP") parameter at each occurrence of a signal on the inter-die signaling pin prior to the occurrence of a number of clocks based on the UID.

DETAILED DESCRIPTION OF THE INVENTION

The exemplary implementations described herein focus on determining unique die identifiers for Serial Peripheral Interface ("SPI") flash memory devices, in which any number of SPI flash memory die may be packaged together as a single device using any desired multichip packaging technique such as the multichip module ("MCM") to realize any one or combination of various capabilities such as low per-bit cost, high density storage, code shadowing to RAM, and fast random access for "execute in place" applications, while preserving the advantages of the SPI interface. However, the techniques described herein may be used for any combination of memory die, whether identical or not, which have fully or partially commonly connected interfaces, and which are packaged together as a single device using any desired multichip packaging technique, including, for example, stacked, mounted in-plane on a small printed circuit board or ceramic substrate, mounted on multi-layer laminated printed circuit boards or ceramic substrates, deposited on a base substrate using thin film technology, and so forth.

Figure 1:
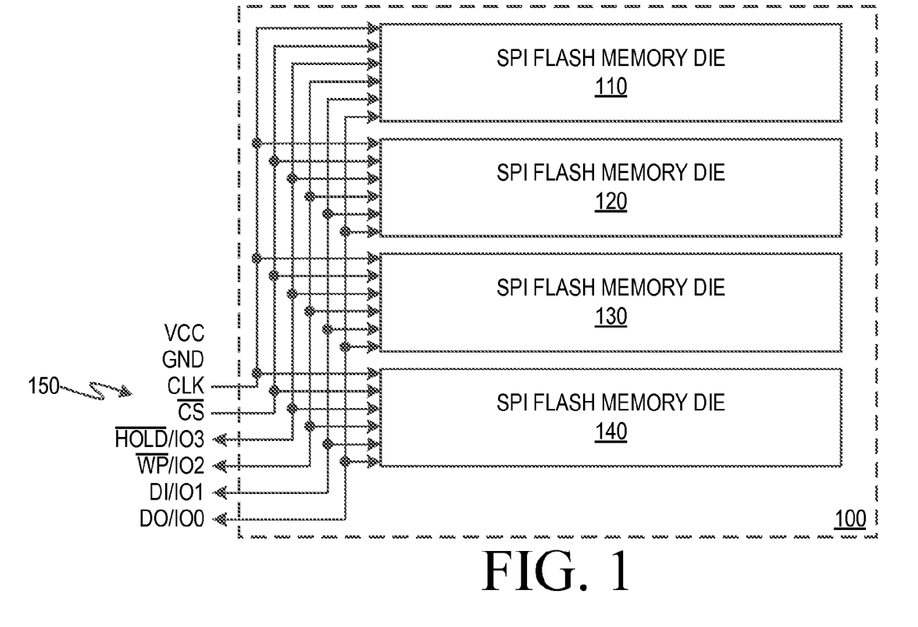
FIG. 1 is a schematic block diagram of an illustrative implementation of a SPI flash memory multichip device.
Figure 2:
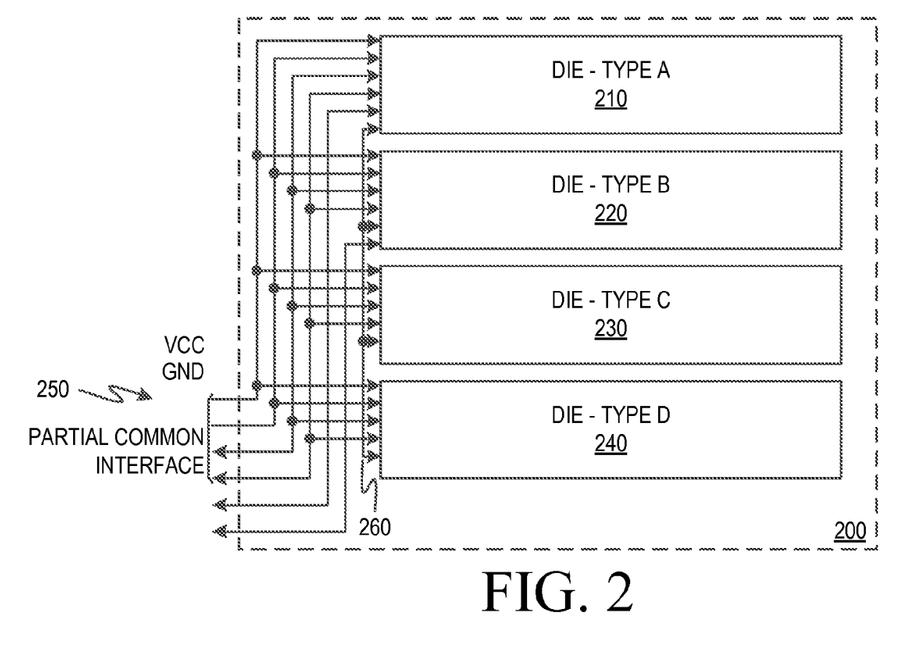
FIG. 2 is a schematic block diagram of an illustrative implementation of a multichip device of any type having commonly packaged memory die of any type.

FIG. 1 shows an illustrative multichip packaged device 100 which has a group of four identical SPI flash memory die 110, 120, 130 and 140 having identical SPI interfaces commonly connected to a set of SPI package pins 150. Illustratively, one of the pins of the SPI interfaces of the respective memory die 110, 120, 130 and 140 may serve for signaling between the die using the techniques described herein. FIG. 2 shows a multichip packaged device 200 which illustratively has a group of four die 210, 220, 230 and 240 which may or may not have identical interfaces of any type or types, but which have partial (shown) or full (not shown) common connections to a set of package pins 250. The die may all be different, or all the same, or some may be different and some the same. Illustratively, a separate common but fully internal connection 260 between the die 210, 220, 230 and 240 may be used to signal between the die using the techniques described herein. Alternatively, one of the common connections to a package pin may serve for signaling between the die using the techniques described herein.

The techniques described herein enable each of two or more commonly packaged die to determine a unique Die Identifier ("DID") relative to the other die or die in the package, and also, if desired, to discover the total number of die participating in the determination. This determination may be made even if the interfaces of the address or address-configurable pins of the die are partly or wholly commonly connected to the package pins. Each of the die has a Unique Identifier ("UID") of any type, illustratively an identifier assigned for production control which is established earlier in the manufacturing process. An external controller sends a specific instruction, illustratively a Determine DID instruction, to initiate internal Die ID determination processes in the commonly packaged die which require a unique Die ID. Each of the die has a signaling pin for signaling with the other die during the Die ID determination process. This signaling pin may be one of the interface pins which is commonly connected with one or more other like interface pins of one or more other die to a corresponding package pin, or may be a pin that is not part of the external interface and therefore may have no connectivity to any of the package pins, but is instead provided for Die ID determination, either exclusively or along with other functionality. As the die are clocked, each die eventually responds by asserting a signal on its signaling pin after a number of clocks as determined by its UID, and assigning itself a Die ID based on the number of signals, if any, asserted by other die prior to its own signaling response. Each die keeps track of the number of signals asserted by other die prior to its own signaling response, as well as, optionally, the total number of signals on the signaling pin to determine the package die count for the device.

Figure 3:
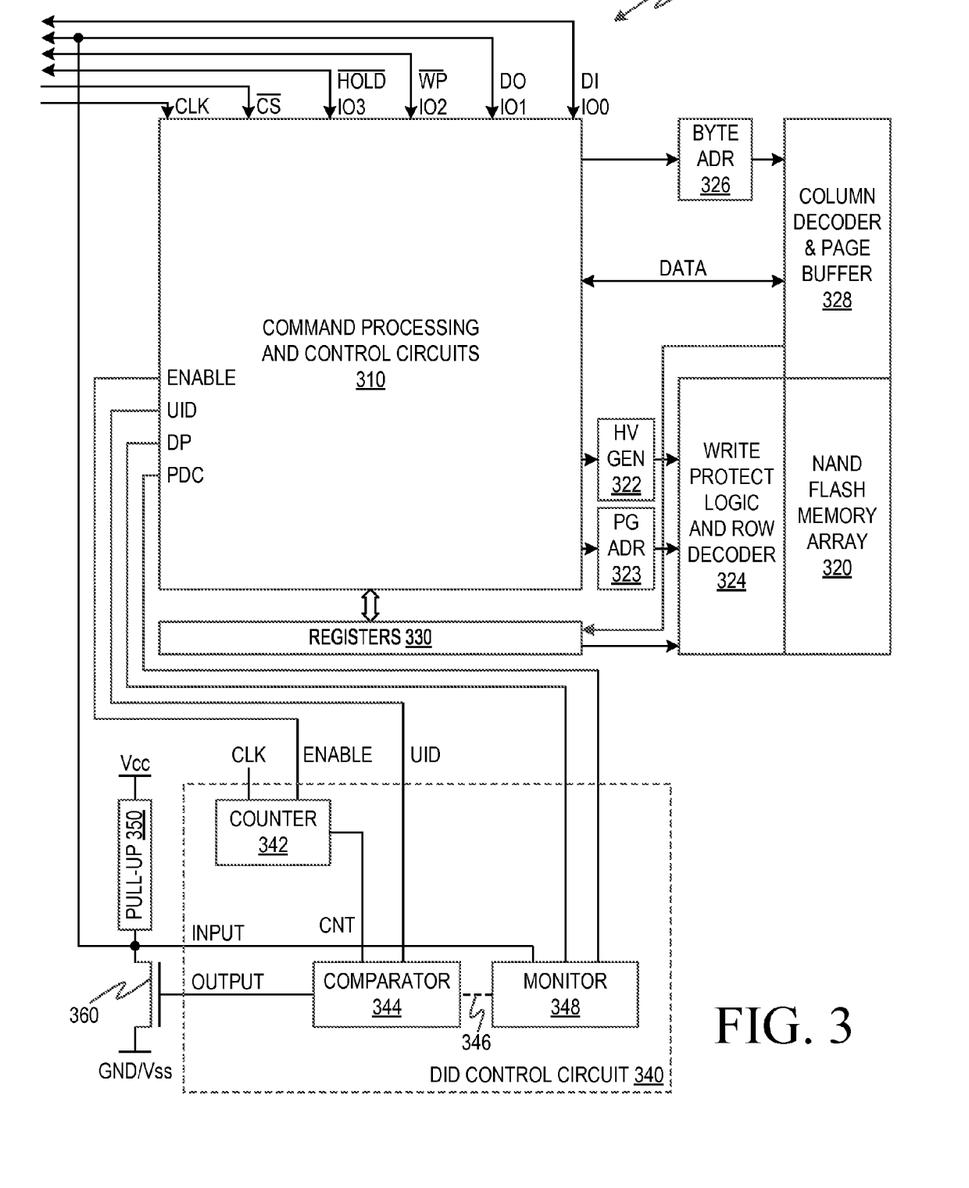
FIG. 3 is a schematic block diagram of a SPI-NOR flash memory die having a DID determination circuit.

FIG. 3 shows an example of a die, illustratively a NOR flash memory die 300, which includes a NOR flash memory array 320 and associated circuitry such as high voltage generator 322, page address latch/counter 323, write-protect logic and row decoder 324, byte address latch/counter 326, and column decoder and page buffer 328. The type of memory and the associated circuitry shown are illustrative, and any type of memory and associated circuitry may be used as desired. Command processing and control circuits 310 process the various instructions received over, illustratively, an SPI interface, which includes pins CLK, /CS, /HOLD or IO3, /WP or IO2, DO or IO1, and DI or IO0. Although the Die ID determination techniques are described in the context of a NOR flash memory die 300 which uses the SPI interface, the techniques are application to all types of memory die which are packaged with a full or partial common interface of any type, including the mixing of different types of memory die such as NOR, NAND, Resistive RAM ("ReRAM"), and electronically erasable programmable read only memory ("EEPROM"). Suitable NOR and NAND memories and additional information on single-bit and multi-bit SPI may be found in, for example, U.S. Pat. No. 7,558,900 issued Jul. 7, 2009 to Jigour et al., and in various publications by Winbond Electronics Corporation, including Winbond Electronics Corporation, W25Q256FV: spiflash 3V 256M-Bit Serial Flash Memory with Dual/Quad SPI & QPI, Revision F, Hsinchu, Taiwan, R.O.C., Oct. 16, 2013; and Winbond Electronics Corporation, W25N01 GV: spiflash 3V 1 G-Bit Serial SLC NAND Flash Memory with Dual/Quad SPI & Continuous Read, Preliminary—Revision B, Hsinchu, Taiwan, R.O.C., Nov. 26, 2013, which hereby are incorporated herein in their entirety by reference thereto.

The Die ID ("DID") control circuit 340 is shown in FIG. 3 separately from the command processing and control circuits 310 for clarity, although it may be integrated into the command processing and control circuits 310 if desired. The DID control circuit 340 includes an enable input ENABLE, a clock input CLK, a Unique ID input UID, a signaling pin input INPUT, a signaling pin output OUTPUT, a Die Position parameter output DP, and a Packaged Die Count parameter output PDC. The signaling pin is connected to a signaling circuit, which may be, for example, any suitable pull-down or pull-up circuit. An illustrative pull-down circuit is shown in FIG. 3, which uses a weak pull up device 350 such as, for example, a transistor, diode, resistor, and the like, which is supplied with VCC, and a pull down device, illustratively a transistor such as a MOSFET transistor 360 which has a source connected to INPUT, a drain connected to GND or VSS, and a gate connected to OUTPUT. While particular values are dependent on the design details of the die, illustratively the weak pull up device 350 may be resistor in the range of 3 Mega Ohm for a 3 volt VCC, and illustratively the MOSFET transistor 360 may be a N-type. To avoid interference with normal operation in commonly connected interface pins, the weak pull up device 350 preferably is functional only during the internal DID determination process. An illustrative pull-up circuit (not shown) may include a strong pull-up device in series with a weak pull-down device.

The UID input of the DID control circuit 340 may receive UID bits from a register, either directly (not shown) or indirectly via the command processing and control circuits 310, and is commonly established early in the manufacturing process. Illustratively, the UID bits may be received from a read-only register or a read/write register in the registers 330. The UID bits are compared with a count CNT generated in a counter 342, which may be clocked by the external clock signal CLK. The counter 342 may be started upon receipt of the ENABLE signal, and is incremented at each clock signal CLK. The output of the comparator is supplied to the gate of the transistor 360 for pulling down the signaling pin in response to a particular relationship between CNT and UID as detected by the comparator 344, for signaling the other die.

A monitor 348 monitors INPUT to detect when the signaling pin is pulled down, for determining DP and PDC. In some implementations, the monitor 348 may also monitor the results of the comparison as represented by connector 346 (shown in phantom) for use in determining DP.

Figure 11:
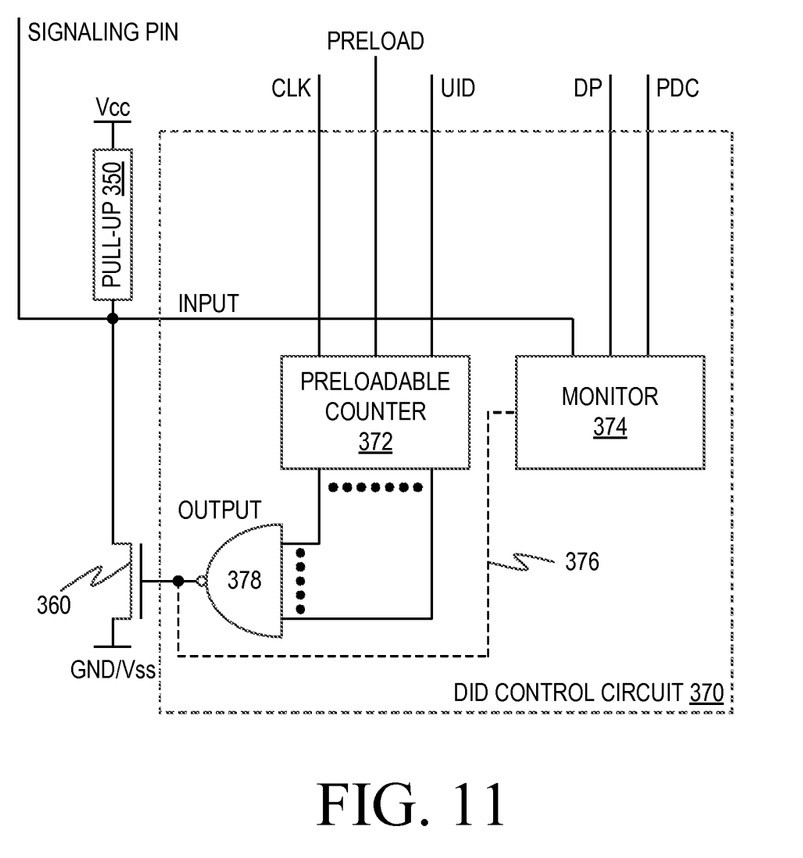
FIG. 11 is a schematic block diagram of an alternative DID determination circuit.

FIG. 11 shows an alternative DID control circuit 370, which includes a preload input PRELOAD, a clock input CLK, a Unique ID input UID, a signaling pin input INPUT, a signaling pin output OUTPUT, a Die Position parameter output DP, and a Packaged Die Count parameter output PDC. The signaling pin is connected to any suitable weak pull up device 350 and to any suitable pull down device, illustratively the transistor 360 which has a source connected to INPUT, a drain connected to GND or VSS, and a gate connected to OUTPUT. The UID bits are preloaded into a preloadable counter 372, which may be a upcounter or a downcounter. The counter 372 may be clocked by the external clock signal CLK. The count stored in the counter 372 is provided over suitable signal lines to any suitable combinational logic circuit for detecting a predetermined condition, illustratively to a NAND gate 378 for detecting a zero count. The output of the NAND gate 378 is supplied to the gate of the transistor 360 for pulling down the signaling pin when the predetermined count is reached, for signaling the other die.

The monitor 374 monitors INPUT to detect when the signaling pin is pulled down, for determining DP and PDC. In some implementations, the monitor 374 may also monitor for the predetermined condition as represented by connector 376 (shown in phantom) for use in determining DP.

The DID control circuits 340 and 370 may be implemented in any suitable manner in hardware, software, firmware, or any combination thereof, including as a state machine.

Figure 4:
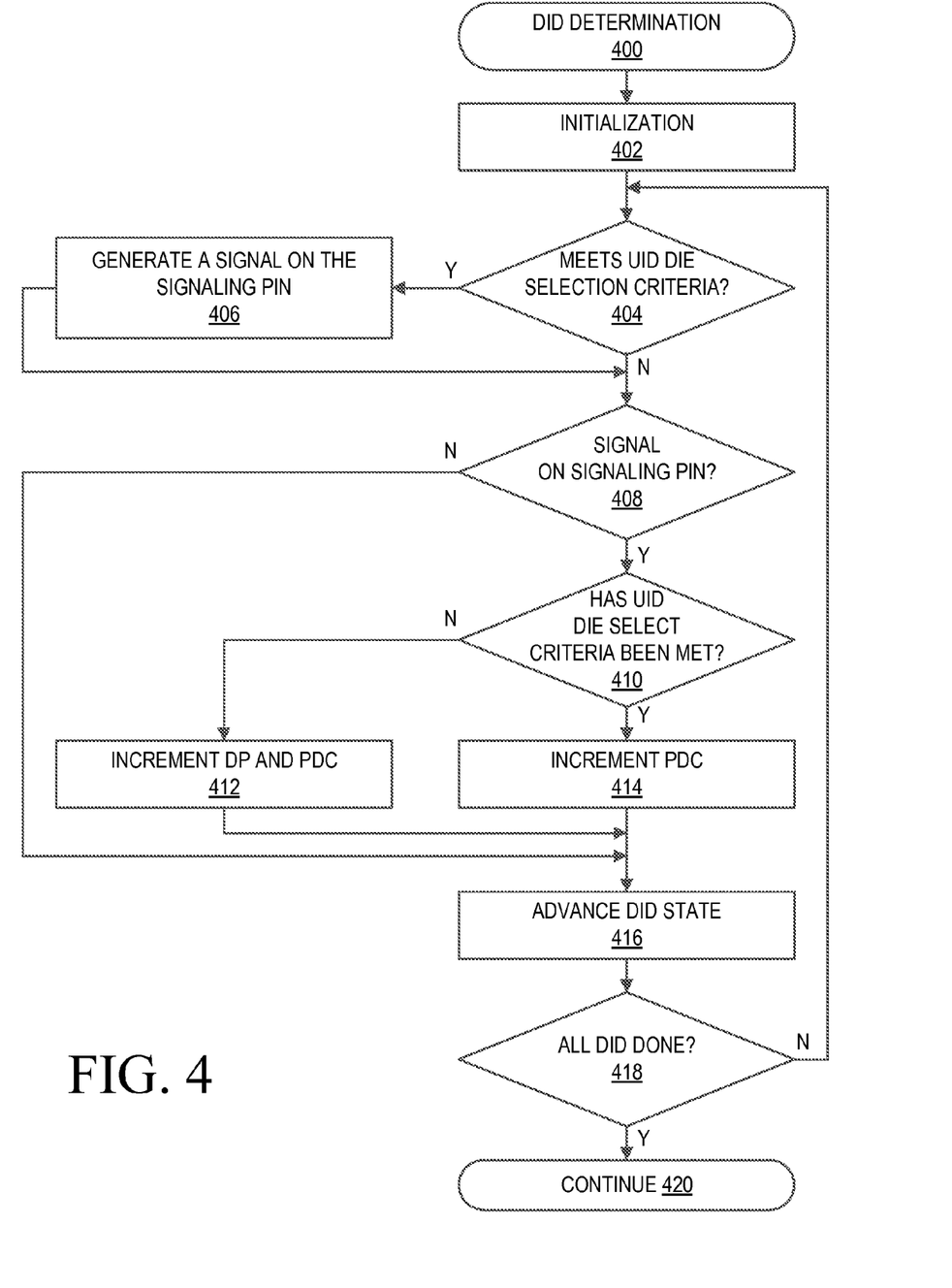
FIG. 4 is a flowchart showing an illustrative DID determination process.

FIG. 4 is an overview of an illustrative suitable process of operation for DID control circuits such as the DID control circuits 340 and 370. Upon receipt of a Determine DID instruction (block 400), which may be in the form of a two byte opcode, for example, any counters and other stateful components in the DID control circuit are initialized (block 402). When the particular die is determined based on its UID to be ready to be given a Die ID (block 404 yes), a signal is asserted on the inter-chip signaling pin of the die (block 406) to notify all commonly-packaged die. The signaling pin is also monitored for detecting when a signal is present on the signaling pin (block 408). If no such signal is detected (block 408 no), the state of the DID control circuit is advanced (block 416) and the process either repeats (block 418 no) or terminates (block 418 yes). If such a signal is detected (block 408 yes) and the UID die selection criteria has not been met (block 410 no), both the DP parameter and the PDC parameter are incremented (block 412). If such a signal is detected (block 408 yes) and the UID die selection criteria has been met (block 410 yes), only the PDC parameter is incremented (block 414). Although in this illustrative process the DID control circuit does not increment DP if it has asserted the signal on the signaling pin, DP may be incremented when the UID die selection criteria is met (just after block 404 yes), depending on whether the Die ID of the first die is desired to be a 0 or 1. The state of the DID control circuit is advanced (block 416) and the process either repeats (block 418 no) or terminates (block 418 yes).

Figure 5:
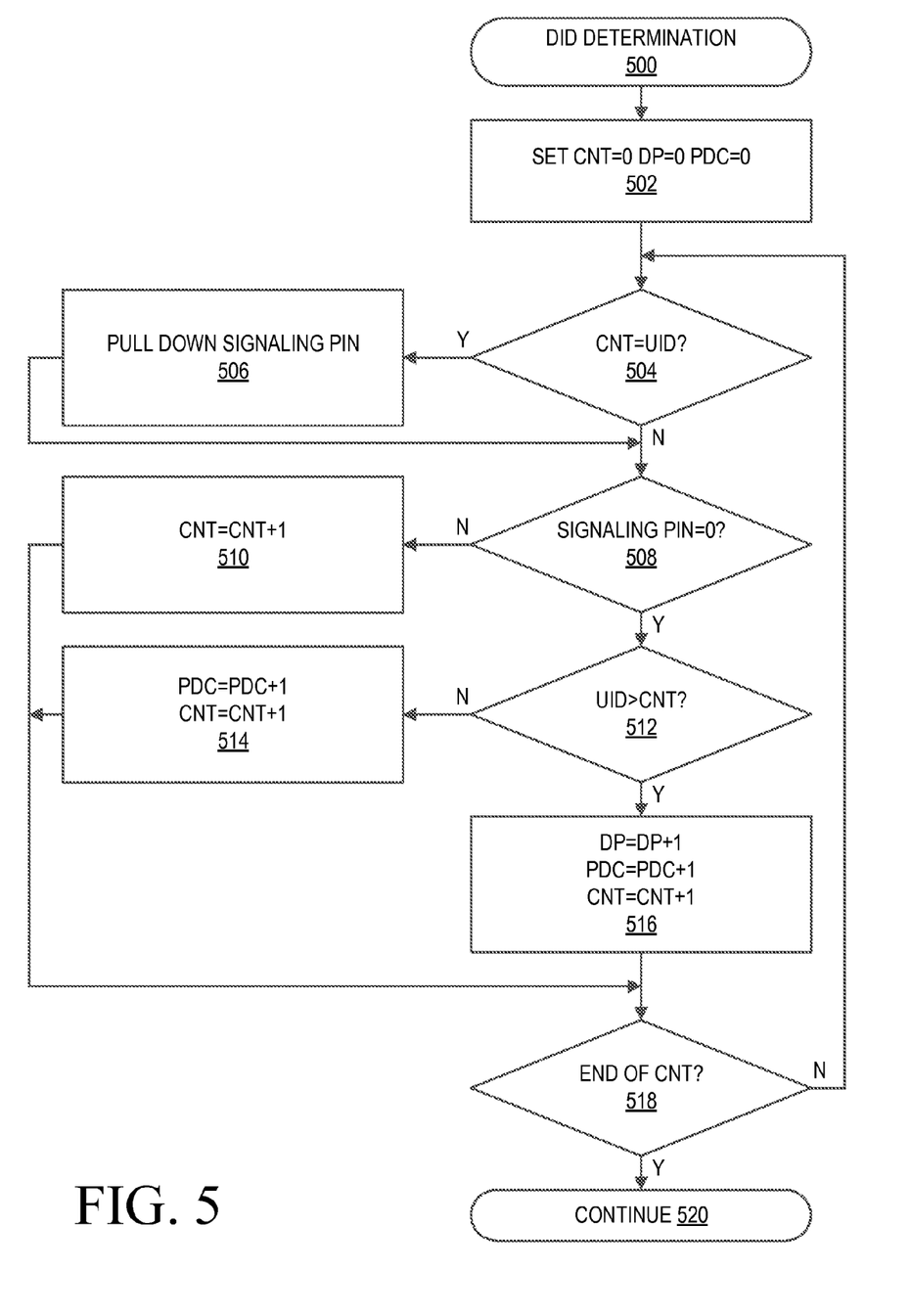
FIG. 5 is a flowchart showing an illustrative DID determination process.
Figure 6:
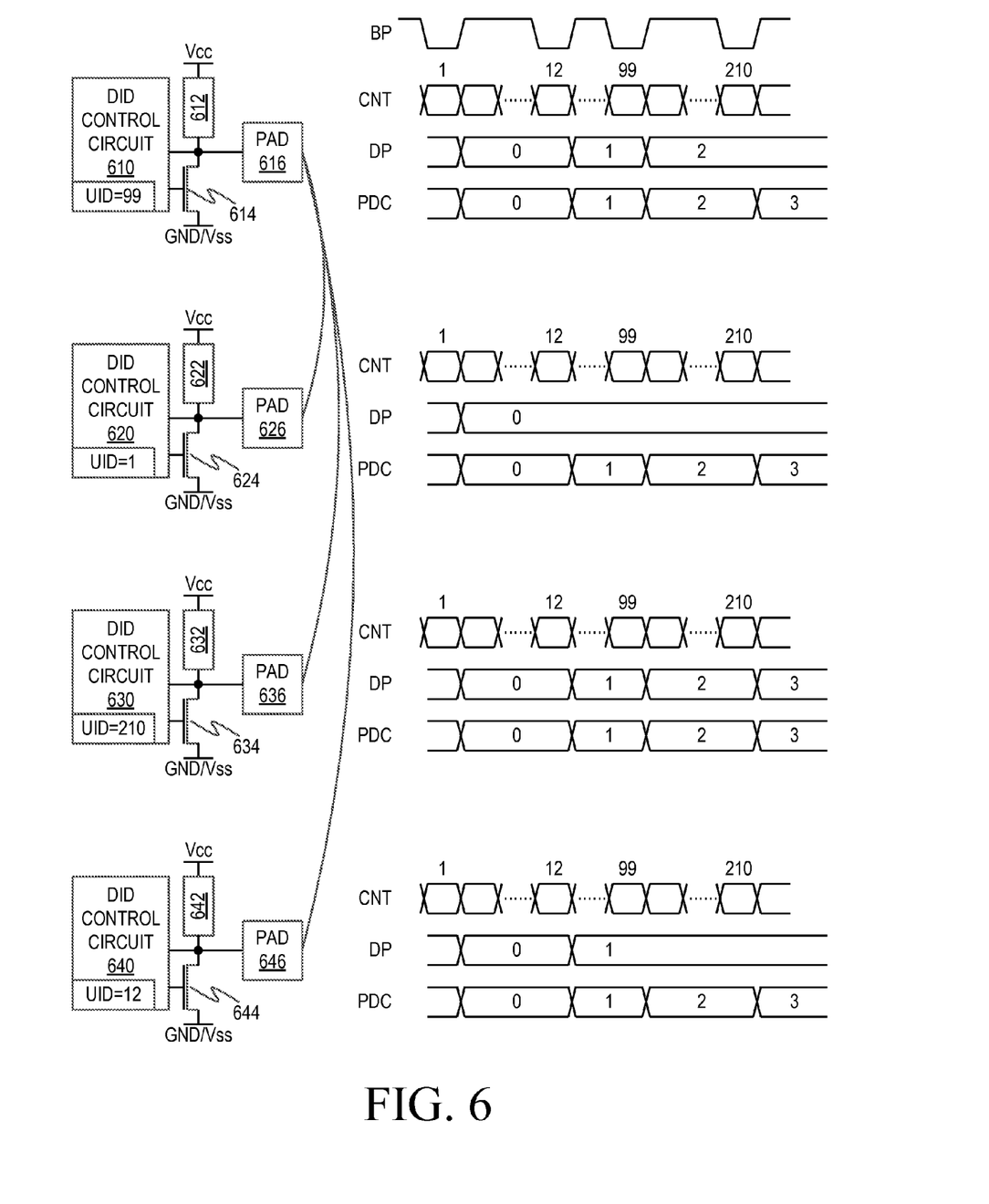
FIG. 6 is a combined schematic circuit diagram and waveform diagram for the illustrative DID determination process of FIG. 5.

FIG. 5 shows one example of a specific implementation 500 of the process of FIG. 4, and FIG. 6 shows various waveforms associated with the process of FIG. 5. The internal DID determination process 500 uses a count parameter CNT, a die position parameter DP, and a Package Die Count parameter PDC, which are initially set to zero (block 502). The PDC is optional, but can be very useful in some operations such as for wrap-around from a last die to a first die in a sequential data read. The UID of the die is compared with CNT (block 504). If a match occurs, the die pulls down its signaling pin (block 506), thereby signaling to the other die in the common package that a Die ID has been determined for a die in the common package. Otherwise the signaling pin is not disturbed. The process 500 continues by monitoring the signaling pin for a pull-down state (block 508). If the signaling pin is not pulled down indicating that no Die ID has been determined, CNT is incremented (block 510) and the process 500 repeats (block 518-No) unless ended (block 518-Yes). If the signaling pin is pulled down, UID is again compared with CNT (block 512), or alternatively a stateful component set when CNT=UID may be read (not shown), to determine whether the particular die has determined its Die ID. If UID is greater than CNT, the particular die has not yet determined its Die ID so that both DP and PDC as well as CNT are incremented (block 516). However, if UID is not greater than CNT, the particular die has determined its Die ID so that DP is no longer incremented, although PDC and CNT continue to be incremented (block 514).

FIG. 6 illustratively shows four DID control circuits 610, 620, 630 and 640 which are coupled to four respective pads 616, 626, 636 and 646 on their respective die. The pads 616, 626, 636 and 646 illustratively are wire bonded together. Each of the pads 616, 626, 636 and 646 respectively has connected thereto pull up devices 612, 622, 632 and 642, and pull down devices 614, 624, 634 and 644, illustratively transistors. The four DID control circuits 610, 620, 630 and 640 are provided with respective UIDs, illustratively having the values 99, 1, 210 and 12 respectively. The CNT waveforms may be the same for all four DID control circuits 610, 620, 630 and 640, as all of the die may be synchronized to a common clock. The DID control circuit 620 is the first to match its UID with CNT on the first count and pulls down its pad 626, so that the other DID control circuits 610, 630 and 640 respond by incrementing their respective DP parameters. DP for the DID control circuit 620 is maintained at its initialized value when the match was detected, specifically "0." The DID control circuit 640 is the next to match its UID with CNT on the twelfth count and pulls down its pad 646, so that DID control circuits 610 and 630 respond by incrementing their respective DP parameters. DP for the DID control circuit 640 is maintained at its once-incremented value when the match was detected, specifically "1." The DID control circuit 610 is the next to match its UID with CNT on the ninety-ninth clock and pulls down its pad 616, so that DID control circuit 630 respond by incrementing its DP parameter. DP for the DID control circuit 610 is maintained at its twice-incremented value when the match was detected, namely "2." The DID control circuit 630 is the next to match its UID with CNT on the two hundred tenth clock and pulls down its pad 636. DP for the DID control circuit 630 is maintained at its thrice-incremented value when the match was detected, namely "3." FIG. 6 also shows that PDC is incremented in response to the first, twelfth, ninety-ninth and two hundred tenth counts. At the end of the process 500, each of the DID control circuits 610, 620, 630 and 640 has a determined DP parameter which may be stored in a read/write register (see, for example, registers 330 (FIG. 3)) as the Die ID, and a determined PDC parameter which may also be stored in a read/write register.

The determination process 500 may be terminated in various ways. As one example, the determination process in each die may terminate when the number of clock cycles reaches a predetermined number or returns to zero. As another example, each die may be pre-programmed with the number of die participating in the determination, or may be provided with the number of die participating in the determination as a parameter of the Determination Instruction, and terminate the determination process when the event counter reaches that number.

Figure 7:
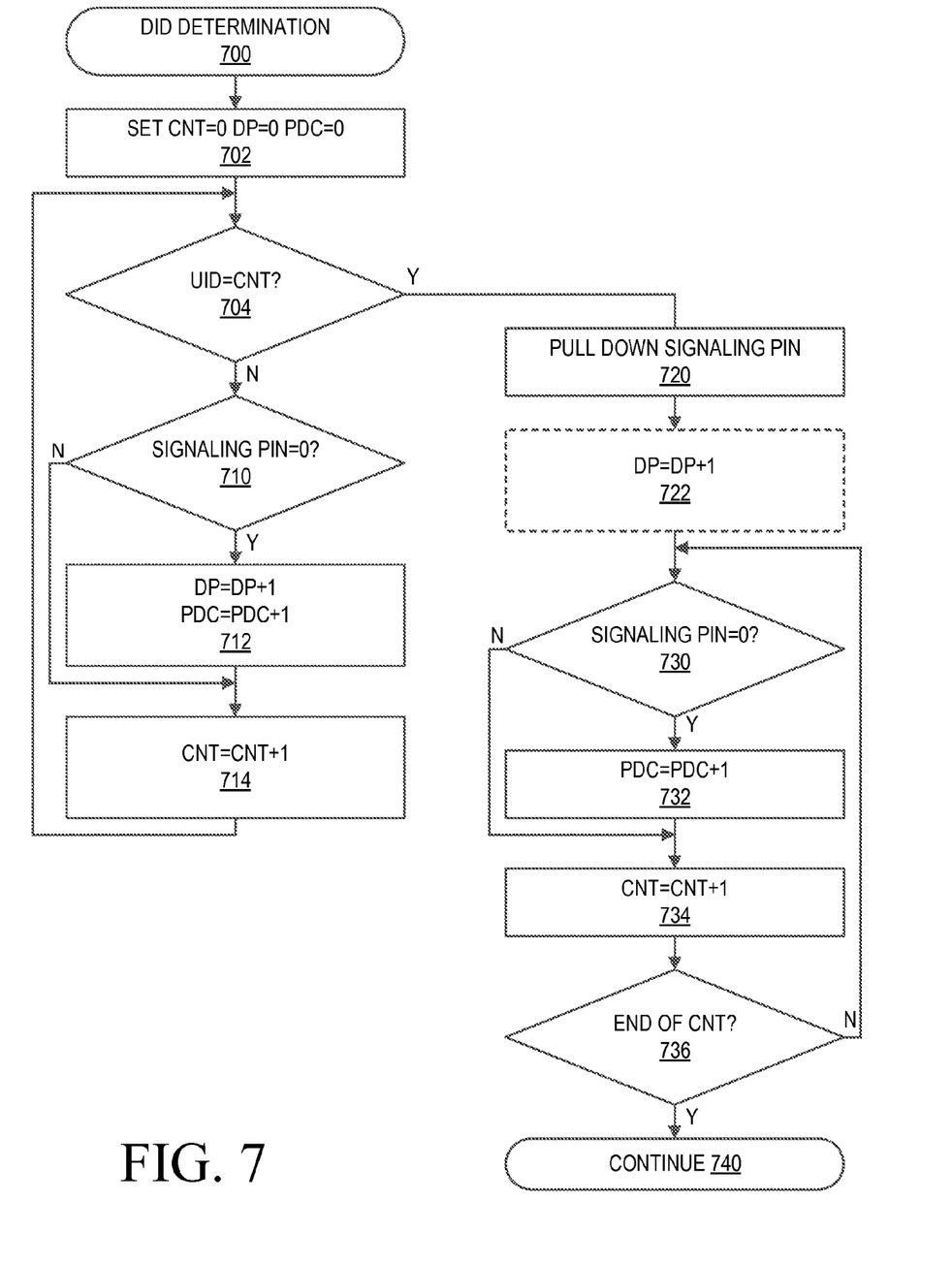
FIG. 7 is a flowchart showing another illustrative DID determination process.

FIG. 7 is a flowchart which shows another illustrative DID determination process 700. When the clock CLK is active, an enable signal is received by a Die ID control circuit, which responds by setting a count parameter "CNT," a Die ID parameter "DID," and a Packaged Die Count parameter "PDC" to zero (block 702). At the next clock CNT is compared with the UID of the die (block 704). If a match is not detected (block 704-No), the state of the signaling pin is detected (block 710). If the signaling pin is not pulled down (block 710-No), which indicates that none of the commonly packaged die have a matching UID, CNT is incremented (block 714) on the next clock, and the process returns to comparing CNT and UID at the next clock (block 704). If the signaling pin is pulled down (block 710-Yes), which indicates that a die other than the particular die has a matching UID, DP and PDC are incremented (block 712) and CNT is incremented (block 714) on the next clock, and the process returns to comparing CNT and UID at the next clock (block 704). Returning to block 704, if a match is detected (block 704-Yes), the comparator output OUTPUT is asserted so that the signaling pin is brought low (block 720) and DP is incremented (block 722) for the last time. If it is desired that the die which pulls down the signaling pin need not count itself for setting the DP parameter (that is, if it is desired that the DP count begins at zero), block 722 may be omitted. Next, the state of the signaling pin is detected (block 730). If the signaling pin is pulled down (block 730-Yes), PDC is incremented (block 732). CNT is incremented in either case (block 734) and a determination is made of whether CNT has reached its end value (block 736). The process 700 either terminates (block 740) or returns to monitoring the signaling pin for pull-down by other die (block 730).

As will be appreciated, variations of these processes and other similar algorithms may be used to determine the die ID using only one signaling connection.

The DID determination processes described herein are particularly advantageous for use in SPI flash memory die which are stacked and packaged in eight pin packages. The full SPI protocol including Quad SPI may be realized in such an eight pin package, where the signaling pin may be one of the SPI interface pins, or may be a specialized pin provided on the die without connection to any of the package pins.

Stacking of lower density die of the same type to form a high density serial flash memory device is one example. With a density of 256 Mb for a single die, for example, two serial flash memory die of the same type may be stacked to achieve a 512 Mb (2×256 Mb) device, and four serial flash memory die of the same type may be stacked to achieve a 1 Gb (4×256 Mb) device. An example of a suitable type of SPI-NOR flash memory die is the type used in product number W25Q256FV by Winbond Electronics Corporation of Hsinchu, Taiwan, R.O.C.; see Winbond Electronics Corporation, W25Q256FV: spiflash 3V 256M-Bit Serial Flash Memory with Dual/Quad SPI & QPI, Revision F, Hsinchu, Taiwan, R.O.C., Oct. 16, 2013, which hereby is incorporated herein in its entirety by reference thereto, and which may be suitably modified to include Die ID determination circuitry and software/firmware and a command and control logic enabled to process a Die Select instruction. Other types of SPI flash memory die may be used, such as four stacked SPI-NAND flash memory die such as the type used in product number W25N01 GV by Winbond Electronics Corporation of Hsinchu, Taiwan, R.O.C., see Winbond Electronics Corporation, W25N01 GV: spiflash 3V 1 G-Bit Serial SLC NAND Flash Memory with Dual/Quad SPI & Continuous Read, Preliminary—Revision B, Hsinchu, Taiwan, R.O.C., Nov. 26, 2013, which hereby is incorporated herein in its entirety by reference thereto, and which may be suitably modified to include Die ID determination circuitry and software/firmware and a command and control logic enabled to process a Die Select instruction. Other types of SPI-NOR and SPI-NAND flash memory die may be used, as desired. As few as two SPI flash memory die may be stacked to advantage, and more generally, any number may be used. While using a power of two may be convenient, the number of SPI flash memory die need not be to the power of two.

Moreover, flash memory die of different types may be stacked to achieve a single memory device having a unique combination of capabilities that is particularly suitable for particular applications. SPI-NOR type flash memory and some types of specially-modified SPI-NAND type flash memory are particularly suitable for code applications such as execute-in-place and code shadowing, while SPI-NAND type flash memory generally is particularly suitable for high density data storage. Both types of flash memory die may be stacked to provide both capabilities in one package. The size of the memory arrays in the various die may be identical or different, or some may be identical and others different. Further information on the stacking of NOR die and NAND die, and the stacking of a performance-enhanced NAND die and a NAND die, are described in United States Patent Application Publication No. US 2012/0084491 published Apr. 5, 2012, in the name of Eungjoon Park et al., which hereby is incorporated herein in its entirety by reference thereto, and which may also be suitably modified to include Die ID determination circuitry and software/firmware and a command and control logic enabled to process a Die Select instruction.

As used herein, the term "memory die" refers to an integrated circuit die which includes a memory array of any type or types, illustratively NOR, NAND, ReRAM, EEPROM, and any combination thereof, and a set of interface pins which include one or more pins for memory addresses and data. Illustrative interface protocols include SPI, Inter-Integrated Circuit ("I2C"), 3-Wire serial, including single-bit and multiple-bit serial interface protocols, parallel, and so forth. A memory die is a die whose primary function is data storage.

As used herein, the term "SPI flash memory die" refers to an integrated circuit die which includes a flash memory array of any type or types, and a set of interface pins which conform to the SPI protocol.

As used herein, the term "pin" refers to an conductive interface element used for external electrical contact to a serial flash memory die, whether a contact on a die such as a bonding pad, a contact mounted on a package including recessed contacts, flush contacts, projecting contacts such as prongs and BGA balls, and so forth.

As used herein, the term "SPI-compliant pins" refers to a set of interface pins which is compliant with the SPI protocol. In accordance with the SPI protocol, six pins may be configurable as single SPI, dual SPI, quad SPI, and Quad Peripheral Interface ("QPI") (also known as Serial Quad Interface, or "SQI"), and including single-bit or multi-bit instruction and/or address input and single-bit or multi-bit data output, although configurability may be limited to any desired subset of these configurations. The six pins provided are chip select /CS, clock CLK, configurable pin DI($IO_0$), configurable pin DO($IO_1$), configurable pin /WP($IO_2$), and configurable pin /HOLD($IO_3$). For single-bit SPI operation, the configurable pins may be configured as data input DI, data output DO (or a single pin DIO may be configured as input and output), write protect bar /WP, and hold bar /HOLD. For dual SPI, the configurable pins may be configured as input/output IO0, input/output IO1, write protect bar /WP, and hold bar /HOLD. For quad SPI and QPI, the configurable pins may be configured as input/output IO0, input/output IO1, input/output IO2, and input/output IO3.

Figure 8:
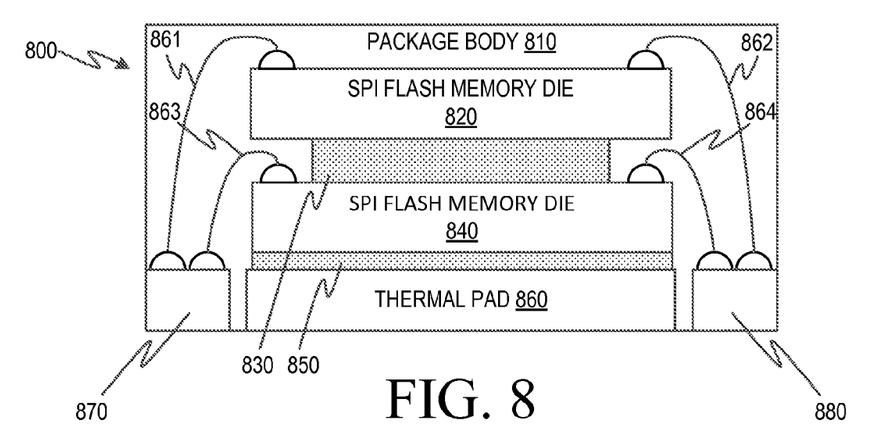
FIG. 8 is a side plan view of a multichip module having stacked memory die with spacers between the die.
Figure 9:
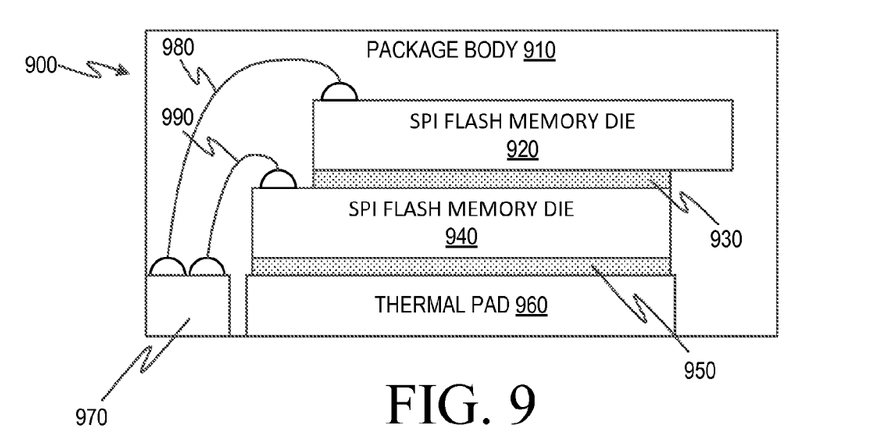
FIG. 9 is a side plan view of a multichip module having stacked memory die using die staggering.
Figure 10:
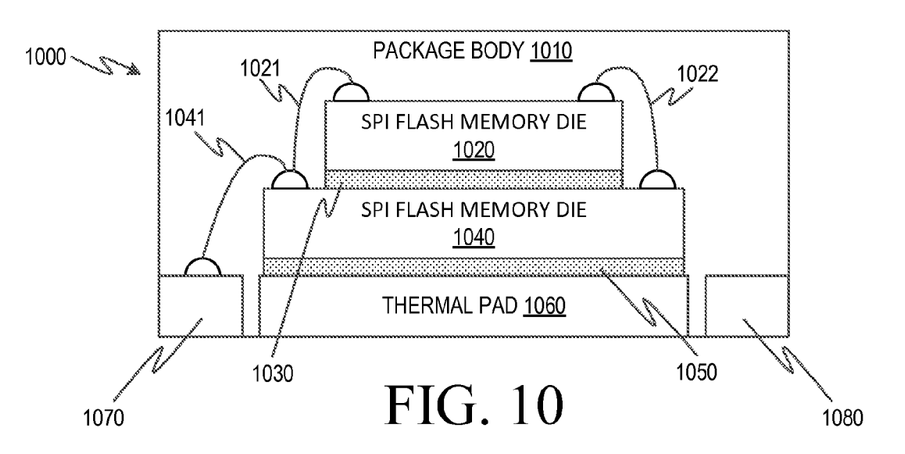
FIG. 10 is a side plan view of a multichip module having stacked memory die of different sizes.

In one illustrative implementation, two or four SPI flash memory die, each having six pins conforming to the SPI protocol in addition to two pins for power ("VCC") and ground ("GND") respectively, are packaged together in the manner shown in FIGS. 8-10. Such stacked and commonly packaged SPI flash memory die may provide any one or any combination of two or more of the following benefits, possibly along with other benefits: (a) a single physical /CS pin for multiple stacked SPI flash memory die; (b) eight-pin package capable of implementing Quad SPI operations; (c) concurrent execution of some SPI operations; (d) only minor modification of existing SPI flash memory die designs is needed; (e) conventional multichip packaging techniques are suitable; and (f) heterogeneous SPI flash memory die may be stacked to achieve multiple capabilities and performance goals. The SPI flash memory device using such stacked SPI flash memory die may be made compatible with traditional flash memory instruction sets, augmented by any suitable "Die Select" instruction. An illustrative Die Select instruction may be a two byte hex opcode followed by an eight bit Die ID. While the number of bits needed depends on the maximum number of die that may be stacked within supported SPI flash memory devices, and while two bits are sufficient for up to four stacked die, eight bits are reserved for the Die ID so that the Die ID may end on a byte boundary as is customary for memory instructions.

The illustrative Die Select instruction may function in the following manner to select any individual SPI flash memory die in a multi-die stacked package. The Die Select instruction is issued by a controller (not shown) to the SPI flash memory device along with the unique Die ID of the particular die to which access is desired. All of the stacked die respond to the Die Select instruction. The die whose die identifier matches the Die ID argument of the Die Select instruction is enabled to respond to the entire SPI instruction set. The other die whose die identifier(s) do not match the Die ID argument of the Die Select instruction are enabled to respond to a subset of the SPI instruction set referred to herein as the Universal instruction subset, being otherwise made nonresponsive to the SPI instruction set. If support for concurrent operations is desired, the SPI command and control logic of the non-selected die may continue to execute any internal operation currently in progress. This capability may be designed into the SPI command and control logic of each of the stacked SPI flash memory die. The illustrative Die Select instruction as well as other aspects of stacking and operating stacked flash memory die is described in copending U.S. patent application in the name of inventors Hui Chen and Teng Su entitled "Stacked Die Flash Memory Device with Serial Peripheral Interface," Ser. No. 14/194,248 Filed Feb. 28, 2014 , which hereby is incorporated herein in its entirety by reference thereto.

While stacked SPI flash memory die may be placed in packages which have additional pins, and while the techniques described in this patent document may be combined with other techniques which make use of the additional pins, advantageously the techniques described herein enable the stacking of numerous SPI flash memory die within a simple and very small footprint eight pin package. Eight-pin packages such as Small Outline Integrated Circuit ("SOIC") type and the Very Very Thin Small Outline No Lead ("WSON") type remain popular choices for serial flash memory devices due to their small footprint in a system printed circuit board layout.

FIG. 8 is a side plan view of an illustrative eight-pin WSON type SPI flash memory device 800 which contains two stacked SPI flash memory die 820 and 840 within a package body 810. While any suitable stacking technique may be used, the SPI flash memory device 800 uses a spacer body 830 to ensure adequate spacing between the bottom of the SPI flash memory die 820 and the wires and wire bonds (illustratively wires 863 and 864 and associate wire bonds) at the top of the SPI flash memory die 840. The spacer body may be of any suitable type, illustrative either a solid body of material with top and bottom adhesive faces, or a thick application of a viscous cement or other bonding material. The SPI flash memory die 840 is attached to a thermal pad 860 using any suitable technique, illustratively a cement 850 or other bonding material. The SPI flash memory die 820 is wire-bonded to various leads of a lead frame (wires 861, 862, 863 and 864 and associated wire bonds to leads 870 and 880 being illustrative). Various leads of the lead frame, illustratively leads 870 and 880, are exposed through the package body 810 to provide pads for connection to external circuitry. Although the wire bonds shown are made from die to lead, alternatively the wire bonds may be from die to die, and then from the bottom die to the lead. Although wire bonds are shown, any other suitable wiring technique between die such as, for example, vias may be used instead.

FIG. 9 is a side plan view of an illustrative eight-pin WSON type SPI flash memory device 900 which contains two stacked SPI flash memory die 920 and 940 within a package body 910. The SPI flash memory device 900 uses a die offset technique to avoid interference between the bottom of the SPI flash memory die 920 and the wires and wire bonds (illustratively wire 990 and associated wire bond) at the top of the SPI flash memory die 940. The SPI flash memory die 920 and 940 are secured in the stack using any suitable material 930, illustratively a cement or a solid body of material with top and bottom adhesive faces. The SPI flash memory die 940 is attached to a thermal pad 960 using any suitable technique, illustratively a cement 950 or other bonding material. The SPI flash memory die 920 and 940 are wire-bonded to various leads of a lead frame (wires 980 and 990 and associated wire bonds and lead 970 being illustrative). Various leads of the lead frame are exposed through the package body 910 (lead 970 being illustrative) to provide pads for connection to external circuitry. Although the wire bonds shown are made from die to lead, alternatively the wire bonds may be from die to die, and then from the bottom die to the lead. Although wire bonds are shown, any other suitable wiring technique between die such as, for example, vias may be used instead.

FIG. 10 is a side plan view of an illustrative eight-pin WSON type SPI flash memory device 1000 which contains two stacked SPI flash memory die 1020 and 1040 within a package body 1010. While any suitable stacking technique may be used, the SPI flash memory device 1000 uses die of different size or shape to avoid interference between the bottom of the SPI flash memory die 1020 and the wires and wire bonds (illustratively wire 1041 and associated wire bond) at the top of the SPI flash memory die 1040. The SPI flash memory die 1020 and 1040 are secured in the stack using any suitable material 1030, illustratively a cement or a solid body of material with top and bottom adhesive faces. The SPI flash memory die 1040 is attached to a thermal pad 1060 using any suitable technique, illustratively a cement 1050 or other bonding material. Some pins of the SPI flash memory die 1020 and 1040 are wire-bonded to various leads of a lead frame (wires 1021 and 1041, associated wire bonds, and lead 1070 being illustrative). Other pins are used for internal connections only (wire 1022 and associated wire bonds being illustrative). The commonly connected pins of the die 1020 and 1040 used for signaling during the Die ID determination process may be the pins connected to the lead 1070 by wires 1021 and 1041 (or to the lead 870 by wires 861 and 863, see FIG. 8), or may be the pins connected to one another by wire 1022. Various leads of the lead frame are exposed through the package body 1010 (leads 1070 and 1080 being illustrative) to provide pads for connection to external circuitry. Although wire bonds are shown, any other suitable wiring technique between die such as, for example, vias may be used instead.

The stacking techniques described herein and other stacking techniques are not necessarily mutually exclusive, and two or more such techniques may be used to manufacture any particular stack. Various stacking techniques are widely disclosed in the art; see, for example, US Patent Application Publication No. US 2011/0195529 published Aug. 11, 2011 in the name of Wu, which hereby is incorporated herein in its entirety by reference thereto.

The description of the invention including its applications and advantages as set forth herein is illustrative and is not intended to limit the scope of the invention, which is set forth in the claims. Variations and modifications of the embodiments disclosed herein are possible, and practical alternatives to and equivalents of the various elements of the embodiments would be understood to those of ordinary skill in the art upon study of this patent document. Moreover, specific values given herein are illustrative, and may be varied as desired. These and other variations and modifications of the embodiments disclosed herein, including of the alternatives and equivalents of the various elements of the embodiments, may be made without departing from the scope and spirit of the invention, including the invention as set forth in the following claims.

The invention claimed is:

1. A method to determine respective die identifiers ("DIDs") for a plurality of commonly-packaged memory die having respective unique identifiers ("UIDs"), comprising:
    enabling a common connection between the memory die;
    establishing respective die selection criteria for the memory die based on the UIDs of the memory die;
    synchronously clocking the memory die;
    in each of the memory die during the clocking thereof:
        determining when the die selection criteria thereof is met as a function of the clocking thereof;
        generating a signal on the common connection in response to the determining step;
        monitoring the common connection prior to the generating step to increment a die position ("DP") parameter when a signal is present on the common connection; and
        establishing the DP parameter as the DID; and
    monitoring the common connection to increment a packaged die count ("PDC") parameter when a signal is present on the common connection;
    wherein the determining step for each of the memory die comprises:
        loading the UID into a comparator thereof;
        incrementing a counter thereof as a function of the clocking thereof to provide a count; and
        comparing the count with the UID to determine a match indicating that the die selection criteria is met.

2. The method of claim 1 further comprising establishing the common connection over a conductor coupled to respective internal signaling pins of the memory die.

3. The method of claim 1 wherein the memory die are packaged in a multichip module configuration with a plurality of package pins, further comprising establishing the common connection over a conductor coupled to respective interface pins of the memory die and one of the package pins.

4. A method to determine respective die identifiers ("DIDs") for a plurality of commonly-packaged memory die having respective unique identifiers ("UIDs"), comprising:
    enabling a common connection between the memory die;
    establishing respective die selection criteria for the memory die based on the UIDs of the memory die;
    synchronously clocking the memory die;
    in each of the memory die during the clocking thereof:
        determining when the die selection criteria thereof is met as a function of the clocking thereof;
        generating a signal on the common connection in response to the determining step;
        monitoring the common connection prior to the generating step to increment a die position ("DP") parameter when a signal is present on the common connection; and
        establishing the DP parameter as the DID; and
    monitoring the common connection to increment a packaged die count ("PDC") parameter when a signal is present on the common connection;
    wherein the determining step for each of the memory die comprises:
        preloading the UID into a counter thereof to establish a value in the counter;
        operating the counter as a function of the clocking thereof to change the value stored in the counter; and
        detecting when the value stored in the counter is a predetermined value indicating that the die selection criteria is met.

5. The method of claim 4 further comprising establishing the common connection over a conductor coupled to respective internal signaling pins of the memory die.

6. The method of claim 4 wherein the memory die are packaged in a multichip module configuration with a plurality of package pins, further comprising establishing the common connection over a conductor coupled to respective interface pins of the memory die and one of the package pins.

7. A multichip module device comprising:
    a plurality of memory die, each comprising a unique identifier ("UID"), a die identifier ("DID") control circuit, a plurality of interface pins, and an inter-die signaling pin; and
    a package containing the plurality of memory die in a multichip module configuration and having a plurality of package pins, at least one of the package pins being coupled to at least one of the interface pins of each of the memory die having a memory addressing capability;
    wherein each of the DID control circuits comprises:
        a signaling circuit coupled to the inter-die signaling pin;
        a counter circuit coupled to the signaling circuit and configured to activate the signaling circuit upon the occurrence of a number of clocks based on the UID; and
        a signal counter coupled to the inter-die signal pin and configured to increment a die position ("DP") parameter at each occurrence of a signal on the inter-die signaling pin prior to the occurrence of a number of clocks based on the UID;
    wherein the signaling circuit comprises a pull-up device coupled to the inter-die signaling pin, and a pull-down device coupled to the inter-die signaling pin, the pull down device having a control input;

wherein the counter circuit comprises a counter configured to provide an incrementing count, and a comparator having a first input coupled to the counter, a second input coupled to the UID, and an output coupled to the control input of the pull-down device, the comparator being configured to provide a pull-down signal on the output upon occurrence of a predetermined relationship between the count and the UID;

wherein the signal counter comprises a pull-down counter coupled to the inter-die signal pin and configured to increment the die position ("DP") parameter at each pull-down of the inter-die signaling pin prior to the occurrence of the predetermined relationship between the count and the UID; and wherein the pull-down counter is further configured to increment a package die count ("PDC") parameter at each pull-down of the inter-die signaling pin.

8. A multichip module device comprising:

a plurality of memory die, each comprising a unique identifier ("UID"), a die identifier ("DID") control circuit, a plurality of interface pins, and an inter-die signaling pin; and a package containing the plurality of memory die in a multichip module configuration and having a plurality of package pins, at least one of the package pins being coupled to at least one of the interface pins of each of the memory die having a memory addressing capability;

wherein each of the DID control circuits comprises:
a signaling circuit coupled to the inter-die signaling pin;
a counter circuit coupled to the signaling circuit and configured to activate the signaling circuit upon the occurrence of a number of clocks based on the UID; and
a signal counter coupled to the inter-die signal pin and configured to increment a die position ("DP") parameter at each occurrence of a signal on the inter-die signaling pin prior to the occurrence of a number of clocks based on the UID;

wherein the signaling circuit comprises a pull-up device coupled to the inter-die signaling pin, and a pull-down device coupled to the inter-die signaling pin, the pull down device having a control input;

wherein the counter circuit comprises a pre-loadable counter configured to initially preload the UID as its value and change its value in accordance with the clock, and a detector configured to provide a pull-down signal on the output upon occurrence of a predetermined value in the counter;

wherein the signal counter comprises a pull-down counter coupled to the inter-die signal pin and configured to increment the die position ("DP") parameter at each pull-down of the inter-die signaling pin prior to the occurrence of the predetermined relationship between the count and the UID; and wherein the pull-down counter is further configured to increment a package die count ("PDC") parameter at each pull-down of the inter-die signaling pin.

9. The multichip module device of claim 7 wherein for each of the memory die, the inter-die signal pin and one of the interface pins are unified.

10. The multichip module device of claim 7 wherein for each of the memory die, the inter-die signal pin is separate and distinct from the interface pins.

11. The multichip module device of claim 7 wherein the signal counter of each of the DID control circuits is further configured to increment the die position ("DP") parameter at an occurrence of a signal on the inter-die signaling pin upon the occurrence of a number of clocks based on the UID.

12. The multichip module device of claim 8 wherein for each of the memory die, the inter-die signal pin and one of the interface pins are unified.

13. The multichip module device of claim 8 wherein for each of the memory die, the inter-die signal pin is separate and distinct from the interface pins.

14. The multichip module device of claim 8 wherein the signal counter of each of the DID control circuits is further configured to increment the die position ("DP") parameter at an occurrence of a signal on the inter-die signaling pin upon the occurrence of a number of clocks based on the UID.

* * * * *